US010599056B1

(12) United States Patent
Toshima et al.

(10) Patent No.: US 10,599,056 B1
(45) Date of Patent: Mar. 24, 2020

(54) POSITION MEASURING METHOD, POSITION MEASURING APPARATUS, AND SEMICONDUCTOR DEVICE MANUFACTURING METHOD

(71) Applicant: Toshiba Memory Corporation, Tokyo (JP)

(72) Inventors: Miki Toshima, Kanagawa (JP); Osamu Yamane, Kanagawa (JP); Yosuke Okamoto, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/263,427

(22) Filed: Jan. 31, 2019

(30) Foreign Application Priority Data

Sep. 7, 2018 (JP) ................................. 2018-168209

(51) Int. Cl.
| H01L 21/67 | (2006.01) |
| G03F 9/00 | (2006.01) |
| G03F 7/20 | (2006.01) |
| H01L 23/544 | (2006.01) |
| H01L 21/68 | (2006.01) |

(52) U.S. Cl.
CPC ........ *G03F 9/7088* (2013.01); *G03F 7/70633* (2013.01); *G03F 9/708* (2013.01); *G03F 9/7065* (2013.01); *G03F 9/7076* (2013.01); *H01L 21/67259* (2013.01); *H01L 21/682* (2013.01); *H01L 23/544* (2013.01); *H01L 2223/54426* (2013.01)

(58) Field of Classification Search
None
See application file for complete search history.

(56) References Cited

U.S. PATENT DOCUMENTS

| 6,822,740 | B2 | 11/2004 | Nomura |
| 6,985,229 | B2 | 1/2006 | Lee et al. |
| 7,629,697 | B2 | 12/2009 | Van Haren et al. |
| 2001/0055720 | A1 | 12/2001 | Sato et al. |
| 2004/0257571 | A1* | 12/2004 | Mieher ................ G01N 21/956 356/401 |
| 2014/0094015 | A1* | 4/2014 | Kasa ..................... H01L 23/544 438/401 |

(Continued)

FOREIGN PATENT DOCUMENTS

JP 2002-64055 A 2/2002

*Primary Examiner* — Asok K Sarkar
(74) *Attorney, Agent, or Firm* — Finnegan, Henderson, Farabow, Garrett & Dunner, L.L.P.

(57) ABSTRACT

According to one embodiment, in a position measuring method, alignment measurement in a light exposure process is executed by irradiating a first mark with light having a wavelength of λ1, with respect to a processing object that includes a first layer and a second layer stacked above a substrate and a resist applied on the second layer. The first mark is provided in the first layer and includes a plurality of segments arranged at a pitch smaller than a resolution limit given by light having the wavelength of λ1. Then, overlay measurement is executed by irradiating the first mark and a second mark with light having a wavelength of λ2 shorter than the wavelength of λ1. The second mark has been formed by performing a light exposure and development process to the resist, and includes a plurality of segments arranged at the pitch.

20 Claims, 13 Drawing Sheets

(56) References Cited

U.S. PATENT DOCUMENTS

| | | | |
|---|---|---|---|
| 2015/0234279 A1* | 8/2015 | Fujiwara | H01L 21/0274 438/763 |
| 2018/0182713 A1* | 6/2018 | Shiba | G03F 7/20 |
| 2018/0197820 A1* | 7/2018 | Shiba | H01L 21/3086 |
| 2018/0321597 A1* | 11/2018 | Javaheri | G01M 11/00 |
| 2019/0346774 A1* | 11/2019 | Maeda | H01L 21/681 |

* cited by examiner

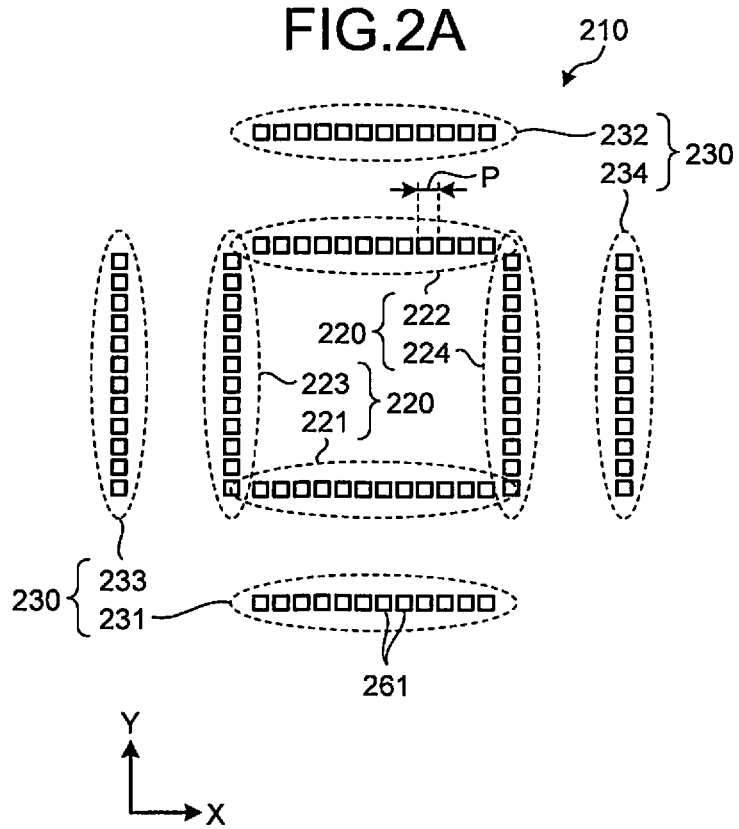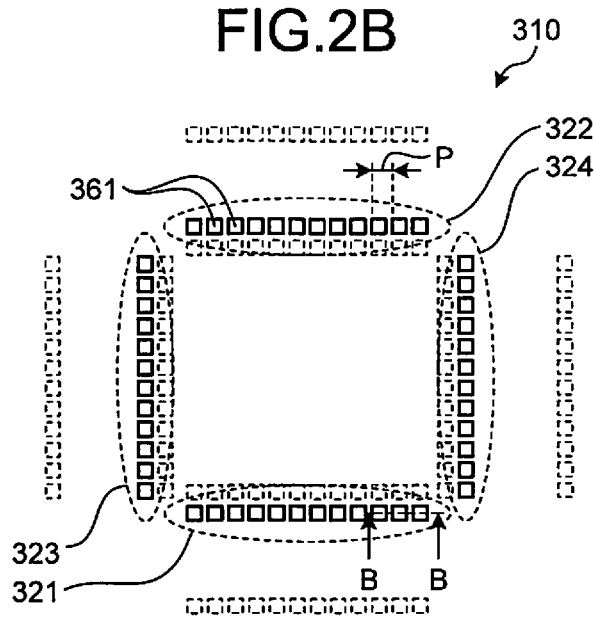

POSITION MEASURING METHOD, POSITION MEASURING APPARATUS, AND SEMICONDUCTOR DEVICE MANUFACTURING METHOD

CROSS-REFERENCE TO RELATED APPLICATIONS

This application is based upon and claims the benefit of priority from Japanese Patent Application No. 2018-168209, filed on Sep. 7, 2018; the entire contents of which are incorporated herein by reference.

FIELD

An embodiment described herein relates generally to a position measuring method, a position measuring apparatus, and a semiconductor device manufacturing method.

BACKGROUND

In a process of manufacturing semiconductor devices, an alignment mark is used for positioning a mask in a light exposure apparatus, and an overlay mark is used for determining an overlay deviation amount between patterns of layers stacked in a vertical direction. The alignment mark and the overlay mark are arranged together with other types of marks on dicing lines of a substrate.

In semiconductor memory devices, it is desired that the area of a memory cell region for arranging memory elements should be set as large as possible to increase the storage capacity. One of the methods for increasing the area of the memory cell region is to reduce the area of dicing lines. However, since various types of marks used for manufacturing semiconductor devices are arranged on the dicing lines, it is difficult to reduce the area of the dicing lines.

BRIEF DESCRIPTION OF THE DRAWINGS

FIGS. 2A and 2B are plan views schematically illustrating a configuration example of marks according to the embodiment;

DETAILED DESCRIPTION

In general, according to one embodiment, in a position measuring method, alignment measurement in a light exposure process is executed by irradiating a first mark with light having a wavelength of $\lambda 1$, with respect to a processing object that includes a first layer and a second layer stacked above a substrate and a resist applied on the second layer. The first mark is provided in the first layer and includes a plurality of segments arranged at a pitch smaller than a resolution limit given by light having the wavelength of $\lambda 1$. Then, overlay measurement is executed by irradiating the first mark and a second mark with light having a wavelength of $\lambda 2$ shorter than the wavelength of $\lambda 1$. The second mark has been formed by performing a light exposure and development process to the resist, and includes a plurality of segments arranged at the pitch.

An exemplary embodiment of a position measuring method, a position measuring apparatus, and a semiconductor device manufacturing method will be explained below in detail with reference to the accompanying drawings. The present invention is not limited to the following embodiment.

Figure 1A:
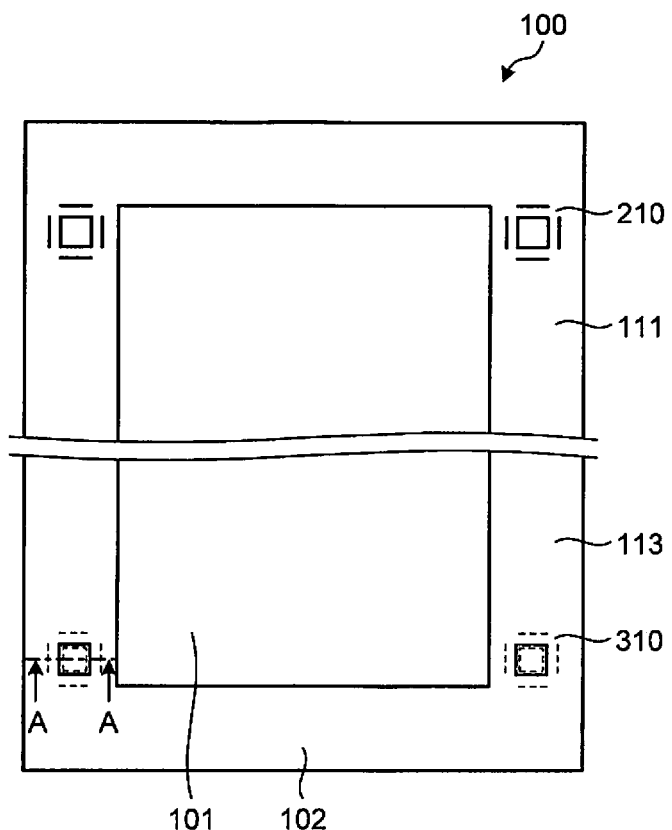
FIGS. 1A and 1B are diagrams schematically illustrating a configuration example of a substrate provided with marks according to an embodiment.
Figure 1B:
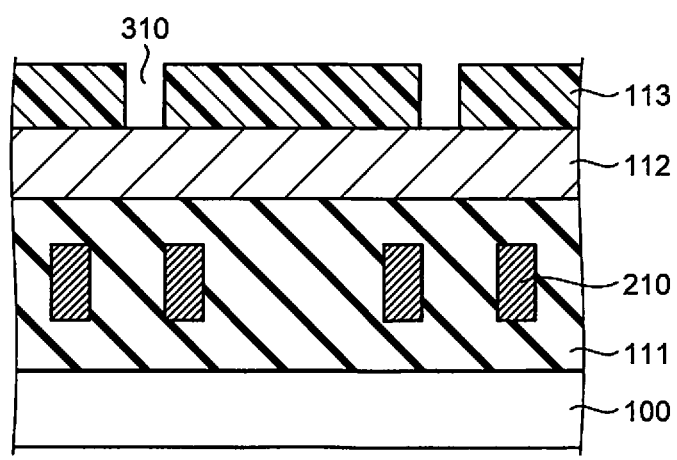
Figure 3:
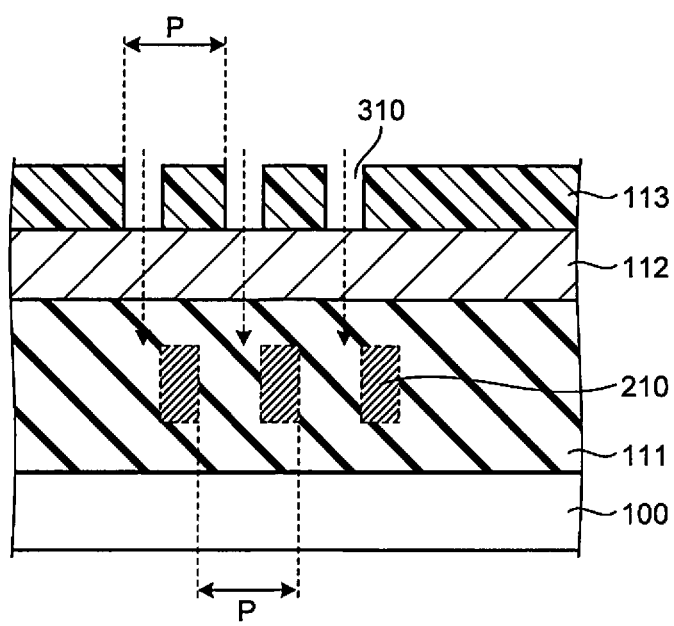
FIG. 3 is a sectional view schematically illustrating a configuration example of marks according to the embodiment.

FIGS. 1A and 1B are diagrams schematically illustrating a configuration example of a substrate provided with marks according to an embodiment. Here, FIG. 1A is a plan view, and FIG. 1B is a sectional view taken along a line A-A of FIG. 1A. In FIG. 1A, the upper half illustrates a plan view of a state before an upper layer and a resist pattern are arranged, and the lower half illustrates a plan view of a state where the upper layer and the resist pattern are arranged on a lower layer. FIGS. 2A and 2B are plan views schematically illustrating a configuration example of marks according to the embodiment. Here, FIG. 2A is a view illustrating a configuration example of a first mark, and FIG. 2B is a view illustrating a configuration example of a second mark. FIG. 3 is a sectional view schematically illustrating a configuration example of marks according to the embodiment, which is taken along a line B-B of FIG. 2B.

A substrate 100, such as a semiconductor substrate, is provided with a rectangular pattern arrangement region 101 for arranging patterns including a device pattern, and a frame-like mark arrangement region 102 present around the pattern arrangement region 101. The mark arrangement region 102 is a region to serve as dicing lines. In the mark arrangement region 102, various types of marks are arranged, which include marks 210 and 310 to be used for alignment measurement and overlay measurement. In this embodiment, marks to be used for the alignment measurement and the overlay measurement are made in common. Specifically, the same set of marks 210 and 310 can be used to perform the alignment measurement and the overlay measurement. As illustrated in FIG. 1A, for example, this set of marks 210 and 310 is provided at a plurality of places of the mark arrangement region 102 on the substrate 100, and the alignment measurement and the overlay measurement can be performed with high accuracy by using the respective sets of marks 210 and 310 at the plurality of places.

On the substrate 100, a first layer 111 serving as a lower layer is arranged. The first layer 111 includes a patterned conductive film or the like, for example. Further, the first layer 111 may include an interlayer insulating film arranged on the conductive film. The first marks 210 are arranged in that part of the first layer 111, which is present on the mark arrangement region 102. As illustrated in FIGS. 1A and 2A, each of the first marks 210 is a bar-in-bar mark having a structure in which line patterns are arranged in quadrangular shapes that are doubly arranged. Hereinafter, the quadrangular shape pattern on the inner side will be referred to as "inner pattern 220", and the quadrangular shape pattern on the outer side will be referred to as "outer pattern 230". The inner pattern 220 includes a first component 221 and a second component 222, which extend in an X-direction and are arranged in parallel with each other, and a third component 223 and a fourth component 224, which extend in a Y-direction and are arranged in parallel with each other. Of these components, the first component 221 and the second component 222 are used as two first direction (X-direction) components in the first mark 210, for overlay measurement with respect to the upper layer. Further, the third component 223 and the fourth component 224 are used as two second direction (Y-direction) components in the first mark 210, for this overlay measurement. The outer pattern 230 includes a fifth component 231 and a sixth component 232, which extend in the X-direction and are arranged in parallel with each other, and a seventh component 233 and an eighth component 234, which extend in the Y-direction and are arranged in parallel with each other.

On the patterned first layer 111, a second layer 112 serving as the upper layer is arranged, and a resist pattern 113 for processing the second layer 112 is arranged on the second layer 112. The second layer 112 is a conductive film or the like to be patterned in a subsequent step, for example. The second marks 310 are arranged in that part of the resist pattern 113, which is present on the mark arrangement region 102. As illustrated in FIGS. 1A and 2B, each of the second marks 310 has a structure in which line patterns are arranged in a quadrangular shape. Each second mark 310 includes a ninth component 321 and a tenth component 322, which extend in an X-direction and are arranged in parallel with each other, and an eleventh component 323 and a twelfth component 324, which extend in a Y-direction and are arranged in parallel with each other. Of these components, the ninth component 321 and the tenth component 322 are used as two first direction (X-direction) components in the second mark 310, for overlay measurement with respect to the lower layer. Further, the eleventh component 323 and the twelfth component 324 are used as two second direction (Y-direction) components in the second mark 310, for this overlay measurement. Further, in this example, for the second mark 310, the distance between the ninth component 321 and the tenth component 322 and the distance between the eleventh component 323 and the twelfth component 324 are set such that, when the centers of the first mark 210 and the second mark 310 are made to agree with each other, the second mark 310 is present to have a predetermined distance from the outer periphery of the inner pattern 220 of the first mark 210. Here, in FIG. 2B, the first mark 210 in the lower layer is illustrated by broken lines.

Further, as illustrated in FIGS. 2A and 2B, each of the components 221 to 224, 231 to 234; and 321 to 324 of the first mark 210 and the second mark 310 has a configuration in which the line pattern is segmentized. Specifically, each of the components 221 to 224 and 231 to 234 of the first mark 210 has a configuration in which a plurality of segments 261 are arranged in a line, and each of the components 321 to 324 of the second mark 310 has a configuration in which a plurality of segments 361 are arranged in a line. Here, the segments 261 and 361 are arranged at a pitch, with which the segments 261 and 361 cannot be resolved by light having a wavelength of $\lambda 1$ used for the alignment measurement, but the segments 261 and 361 can be resolved by light having a wavelength of $\lambda 2$ ($<\lambda 1$) used for the overlay measurement. Where, in a light exposure process, NA1 denotes the numerical aperture of a position measuring unit used for the alignment measurement, and NA2 denotes the numerical aperture of a position measuring unit used for the overlay measurement, the pitch P of the segments 261 and 361 is set to fall within a range expressed by the following formula (1).

$$\lambda 2/NA2 < P < \lambda 1/NA1 \quad (1)$$

Further, for example, the width and length (size) of each of the components 221 to 224 and 231 to 234 forming the first mark 210 are substantially equal to the width and length (size) of each of the components 321 to 324 forming the second mark 310. The first mark 210 and the second mark 310 having the configurations described above are used as alignment marks in the alignment measurement, and are used as overlay marks in the overlay measurement. Further, the first mark 210 and the second mark 310 illustrated here are designed to be used in bright field measurement.

Figure 4:
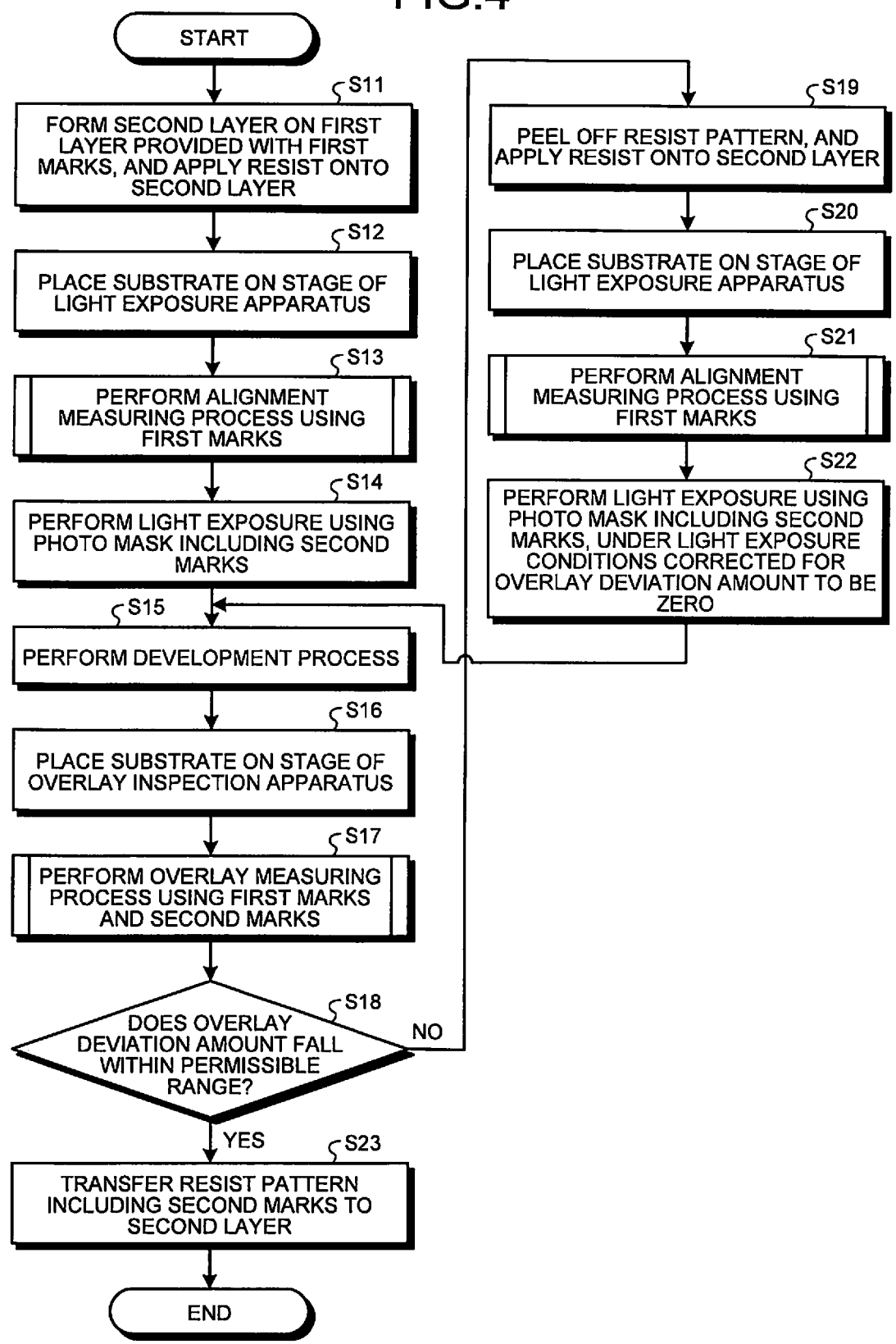
FIG. 4 is a flowchart illustrating an example of the sequence of a semiconductor device manufacturing method including a position measuring method according to the embodiment.

Next, an explanation will be given of a position measuring method and a semiconductor device manufacturing method. FIG. 4 is a flowchart illustrating an example of the sequence of a semiconductor device manufacturing method including a position measuring method according to the embodiment. First, a second layer 112 is formed on a substrate 100 including a first layer 111 provided with first marks 210, and, thereafter, a resist is applied onto the second layer 112 in a coating and developing apparatus (step S11).

Figure 5:
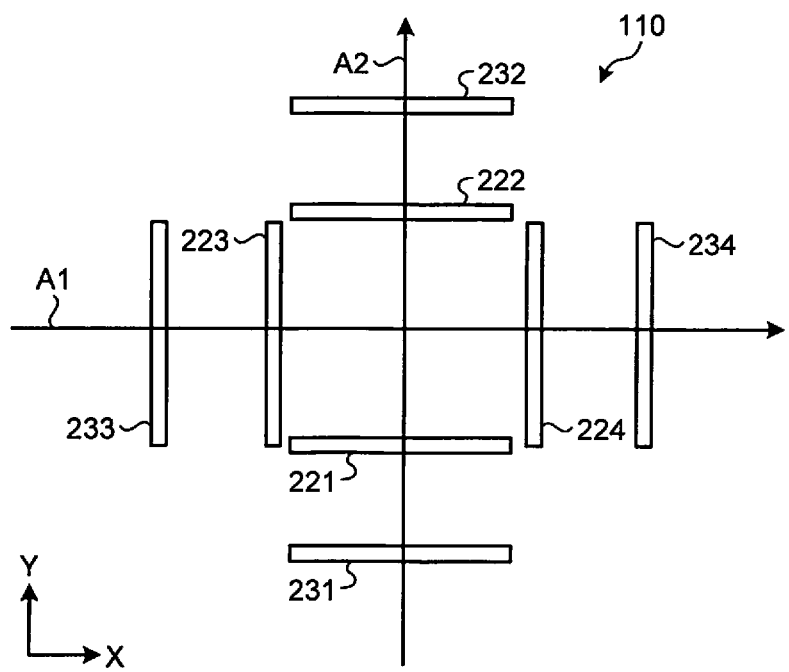
FIG. 5 is a diagram illustrating an image of a first mark in alignment measurement.

Then, the substrate 100 with the resist applied thereon is placed on the stage of a light exposure apparatus (step S12). Thereafter, in a position measuring unit of the light exposure apparatus, an alignment measuring process using the first marks 210 is performed (step S13). Specifically, alignment measurement is performed by irradiating the first marks 210 with light having the wavelength of $\lambda 1$. FIG. 5 is a diagram illustrating an image of a first mark in the alignment measurement. As described above, since the segments 261 forming the first mark 210 cannot be resolved by light having the wavelength of $\lambda 1$, when the first mark 210 is irradiated with light having the wavelength of $\lambda 1$, as illustrated in FIG. 5, the components 221 to 224 and 231 to 234 come to be not segmentized but recognized as line patterns. In the light exposure apparatus, the center position of each first mark 210 is acquired from the first mark 210 recognized as line patterns, and this center position is used to detect the position of the substrate 100 on the stage of the light exposure apparatus.

Figure 6:
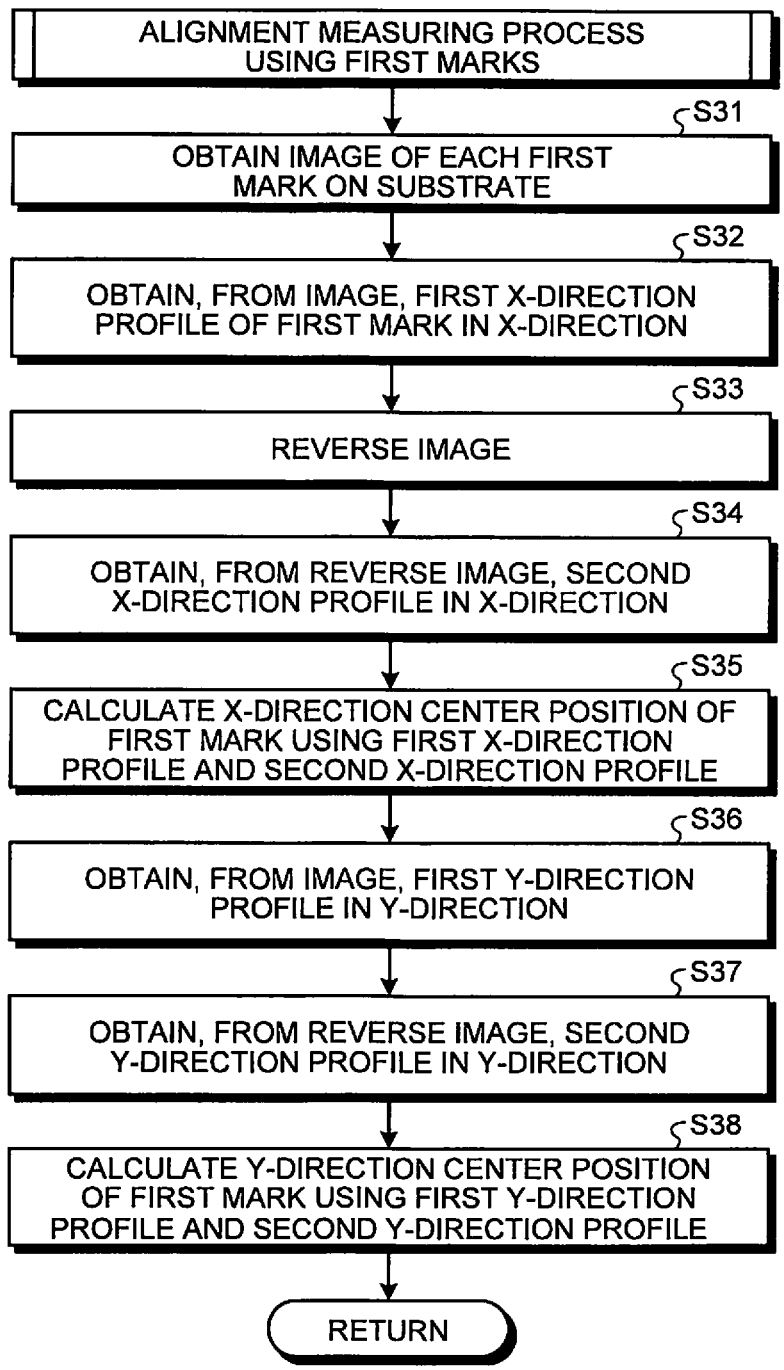
FIG. 6 is a flowchart illustrating an example of an alignment measuring process using first marks.

FIG. 6 is a flowchart illustrating an example of an alignment measuring process using the first marks. First, image pickup is performed to each of the first marks 210 on the substrate 100 placed on the stage of the light exposure apparatus to obtain an image of each first mark 210 (step S31). Then, from this image, a first X-direction profile of the first mark 210 in the X-direction is obtained (step S32). Here, as indicated by an arrow A1 in FIG. 5, the first X-direction profile is obtained at positions across the seventh component 233, the third component 223, the fourth component 224, and the eighth component 234, which extend in the Y-direction. The first X-direction profile is generated by reading an intensity of the image at the respective positions on the arrow A1.

Figure 7:
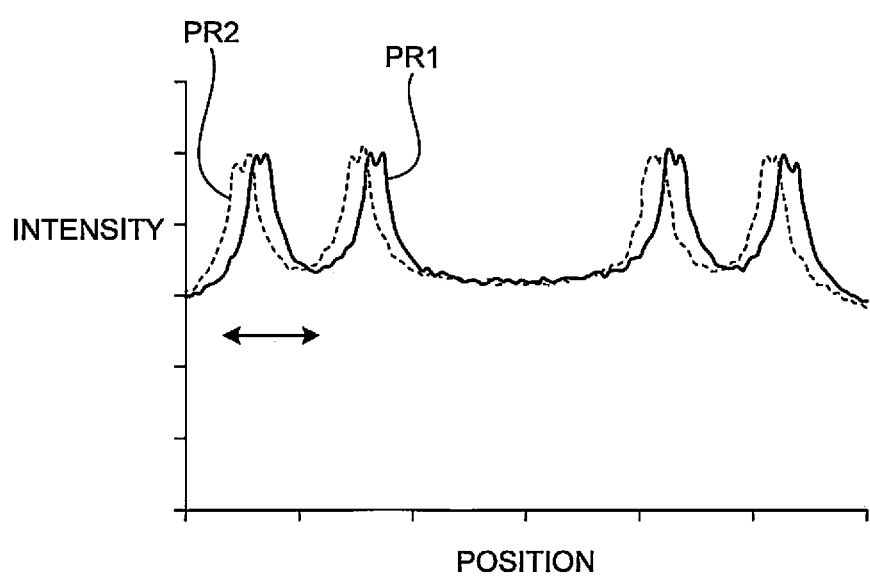
FIG. 7 is a diagram illustrating an example of X-direction profiles in the alignment measuring process.

FIG. 7 is a diagram illustrating an example of X-direction profiles in the alignment measuring process. In FIG. 7, the horizontal axis indicates a position, and the vertical axis indicates an intensity. In FIG. 7, the solid line illustrates the first X-direction profile PR1.

Then, the image is reversed (step S33), and, from this reverse image, a second X-direction profile of the first mark 210 in the X-direction is obtained (step S34). For example, the second X-direction profile is obtained at the same positions on the arrow A1 in the reverse image. In FIG. 7, the broken line illustrates the second X-direction profile PR2.

Thereafter, the X-direction center position of the first mark 210 is calculated using the first X-direction profile and the second X-direction profile (step S35). For example, while the overlaying position between the first X-direction profile PR1 and the second X-direction profile PR2 in FIG. 7 is shifted, an inverse autocorrelation therebetween is grasped, and the position highest in this correlation is assumed as the center position of the first mark 210.

Then, from the image described above, a first Y-direction profile of the first mark 210 in the Y-direction is obtained (step S36). Here, as indicated by an arrow A2 in FIG. 5, the first Y-direction profile is obtained at positions across the fifth component 231, the first component 221, the second component 222, and the sixth component 232, which extend in the X-direction. The first Y-direction profile is generated by reading the intensity of the image at the respective positions on the arrow A2.

Further, from the reverse image, a second Y-direction profile of the first mark 210 in the Y-direction is obtained (step S37). For example, the second Y-direction profile is obtained at the same positions on the arrow A2 in the reverse image. Thereafter, the Y-direction center position of the first mark 210 is calculated using the first Y-direction profile and the second Y-direction profile (step S38). The Y-direction center position is calculated by using a method substantially the same as that for the X-direction center position. As a result, the alignment measuring process using each of the first marks 210 ends, and the processing sequence returns to FIG. 4.

With reference to FIG. 4 again, in the light exposure apparatus, a light exposure process using a photo mask including the second marks 310 is performed (step S14). In this light exposure process, light exposure is performed to the resist in a state where the second marks 310 is set to overlap with the first marks 210 in the first layer 111. Thereafter, the substrate 100 is transferred from the light exposure apparatus to the coating and developing apparatus, and a development process is performed to the substrate 100 (step S15). Consequently, for example, as illustrated in FIGS. 1B and 3, a resist pattern 113 is formed to include the second marks 310 at positions corresponding to the arrangement positions of the first marks 210 in the first layer 111. Thereafter, the substrate 100 is placed on the stage of an overlay inspection apparatus serving as a position measuring apparatus (step S16).

Figure 8A:
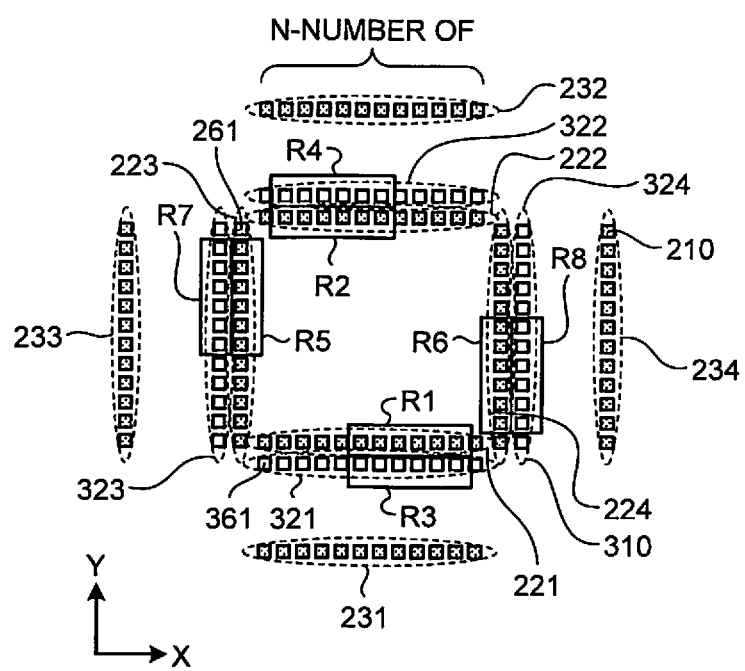
FIGS. 8A and 8B are diagrams illustrating an example of a first mark and a second mark.
Figure 8B:
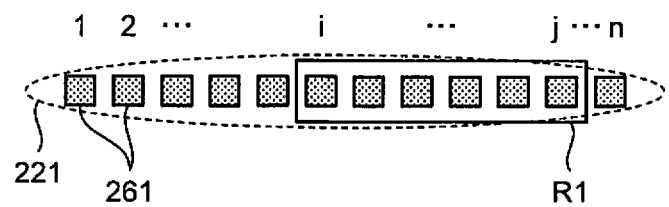

Then, in the overlay inspection apparatus, an overlay measuring process using the first marks 210 and the second marks 310 is performed (step S17). Specifically, overlay measurement is performed by irradiating the first marks 210 and the second marks 310 with light having the wavelength of λ2 shorter than the wavelength of λ1. FIGS. 8A and 8B are diagrams illustrating an example of a first mark and a second mark. Here, FIG. 8A is a diagram illustrating an image of a first mark and a second mark in the overlay measurement, and FIG. 8B is a diagram illustrating an example of how to give numbers to the segments of the first component forming the first mark. As described above, since the segments 261 and 361 forming the first mark 210 and the second mark 310 can be resolved by light having the wavelength of λ2, when the first mark 210 and the second mark 310 are irradiated with the light having the wavelength of λ2, as illustrated in FIG. 8A, each of the components 221 to 224, 231 to 234, and 321 to 324 comes to be recognized as a pattern in which the segments 261 or 361 are arrayed in a line (which will be referred to as "segmentized line pattern", hereinafter). In the overlay inspection apparatus, the first mark 210 and the second mark 310, which are in a state of including such segmentized line patterns, are used to calculate an overlay deviation amount.

Figure 9A:
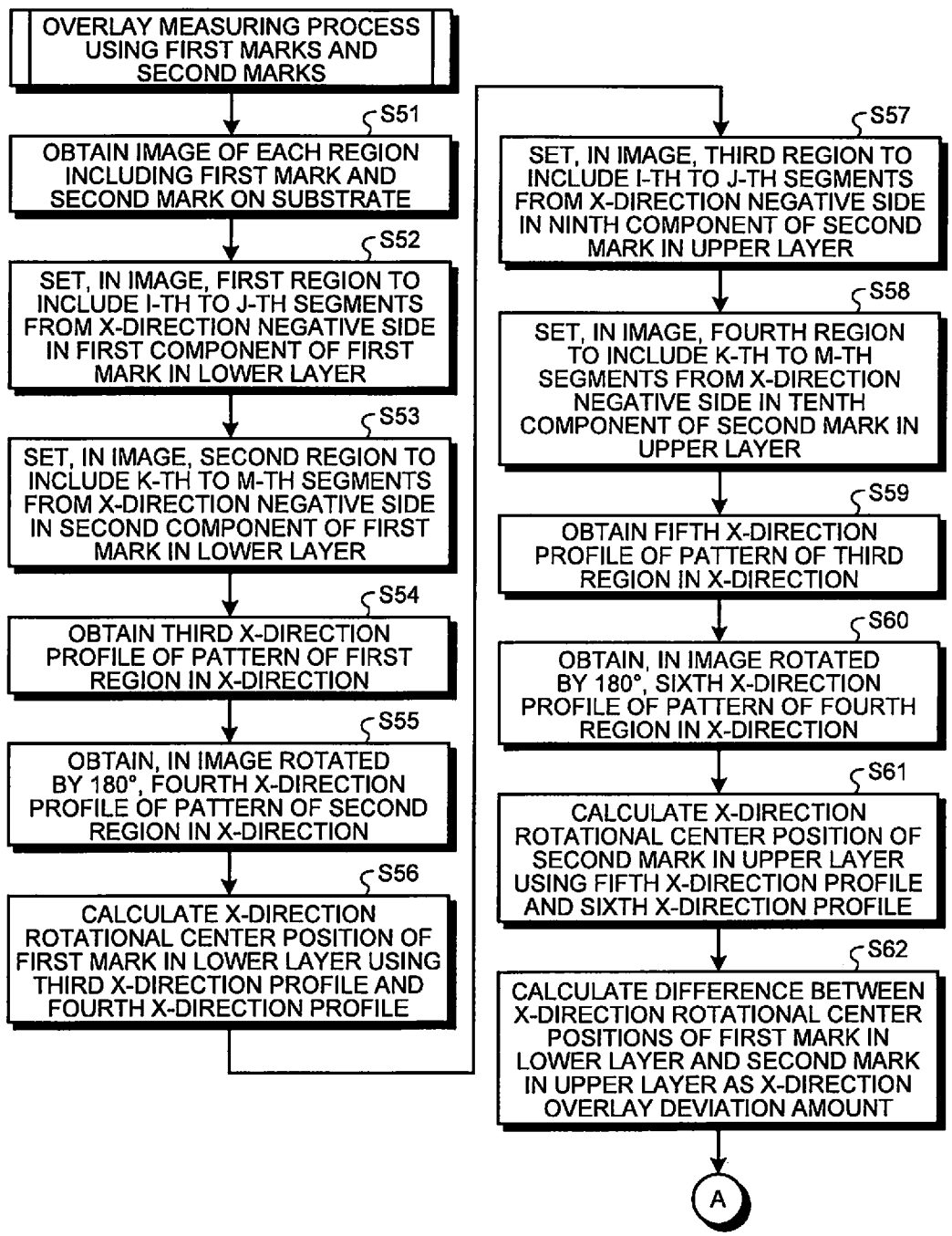
FIGS. 9A and 9B are flowcharts illustrating an example of an overlay measuring process using first marks and second marks.
Figure 9B:
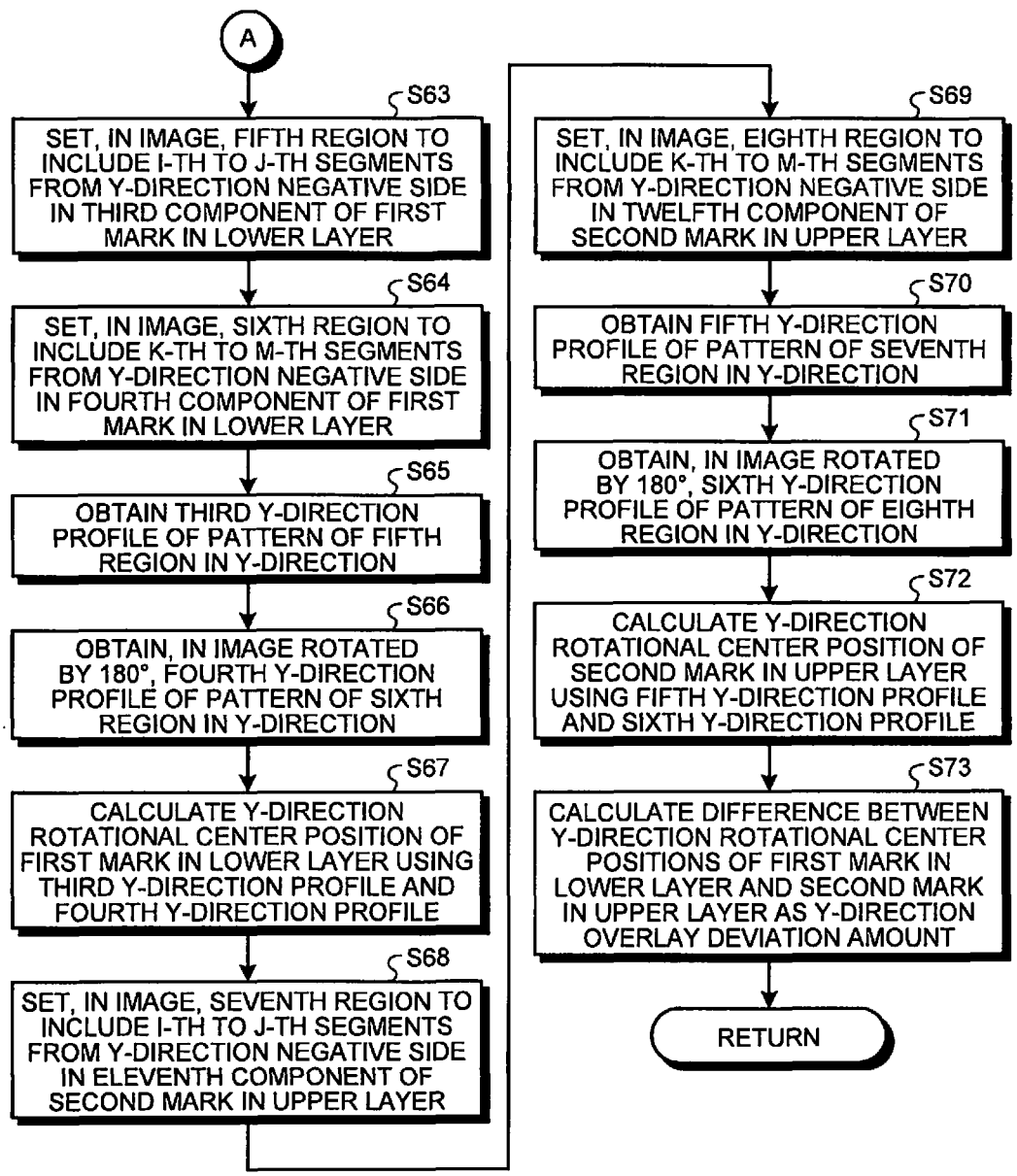

FIGS. 9A and 9B are a flowchart illustrating an example of an overlay measuring process using the first marks and the second marks. First, image pickup is performed to each region including a first mark 210 and a second mark 310 on the substrate 100 placed on the stage of the overlay inspection apparatus to obtain an image including the first mark 210 and the second mark 310 (step S51).

Then, in this image, a first region R1 is set to include the i-th to j-th segments 261 from the X-direction negative side in the first component 221 of the first mark 210 in the lower layer (step S52). Here, as illustrated by an example in FIG. 8B, it is assumed that each of the components 221 to 224, 231 to 234, and 321 to 324 forming the first mark 210 and the second mark 310 consists of n-number of segments 261 or 361 ("n" is an integer of 2 or more). Each of "i" and "j" is an integer of 1 or more and "n" or less, and "i<j" is satisfied. Further, it is assumed that, in each of the components 221 to 224, 231 to 234, and 321 to 324, the segments are given numbers of "1, 2, ... n" in the order from the end of the X-direction negative side or the end of the Y-direction negative side.

Then, in this image, a second region R2 is set to include the k-th to m-th segments 261 from the X-direction negative side in the second component 222 of the first mark 210 in the lower layer (step S53). It is set such that, when the image is rotated by 180° about the center of the first mark 210 or the second mark 310, the second region R2 of the rotated image agrees in position with the first region R1 of the original image. Here, each of "k" and "m" is an integer of 1 or more and "n" or less, and "k<m", "i≠k", and "j≠m" are satisfied. Further, "i", "j", "k", and "m" satisfy the following formulas (2) and (3).

$$i+m=n+1 \qquad (2)$$

$$j+k=n+1 \qquad (3)$$

Further, in general, in the case of a pattern arranged at a predetermined pitch, processing becomes unstable more at the end portion than near the center. Accordingly, it is likely that the position closer to the end portion is more disordered in size or the like and the position closer to the center of the array is more stable without disorder in size or the like. For this reason, it is preferable to select a region including segments 261 or 361, which satisfy "i≥2", "j≤n−1", "k≥2", and "m≤n−1". Further, the first region R1 and the second region R2 may include segments 261 present at positions the same as each other. However, a case is excluded where all of the segments 261 included in the first region R1 are the same in position as those in the second region R2. This is because the rotational center position cannot be obtained in this case.

As described above, in the non-rotated image, the array of numbers given to segments 261 to be selected as the first region R1 from the first component 221 is different from the array of numbers given to segments 261 to be selected as the second region R2 from the second component 222.

Figure 10:
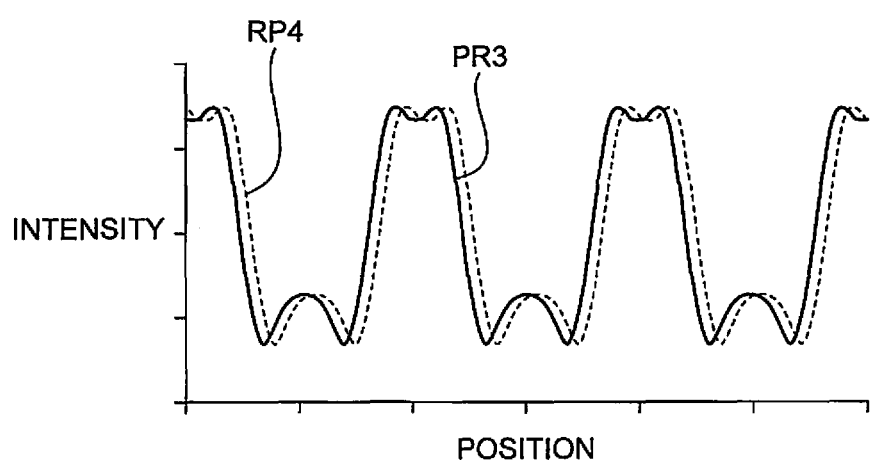
FIG. 10 is a diagram illustrating an example of X-direction profiles in the overlay measuring process.

Then, from this image, a third X-direction profile of the pattern of the first region R1 in the X-direction is obtained (step S54). FIG. 10 is a diagram illustrating an example of X-direction profiles in the overlay measuring process. In FIG. 10, the horizontal axis indicates a position, and the vertical axis indicates the intensity. In FIG. 10, the solid line illustrates the third X-direction profile PR3.

Further, the image is rotated by 180° in its plane about the center of the first mark 210 or the second mark 310, and, in this rotated image, a fourth X-direction profile of the pattern of the second region R2 in the X-direction is obtained (step S55). In FIG. 10, the broken line illustrates the fourth X-direction profile PR4.

Then, the X-direction rotational center position of the first mark 210 in the lower layer is calculated using the third X-direction profile and the fourth X-direction profile (step S56). Here, while the rotational center is shifted, the correlation between the third X-direction profile and the fourth X-direction profile is grasped, and the position highest in this correlation is assumed as the rotational center position of the first mark 210.

Thereafter, in the image obtained in step S51, a third region R3 is set to include the i-th to j-th segments 361 from the X-direction negative side in the ninth component 321 of the second mark 310 in the upper layer (step S57).

Further, in this image, a fourth region R4 is set to include the k-th to m-th segments 361 from the X-direction negative side in the tenth component 322 of the second mark 310 in the upper layer (step S58).

Then, from this image, a fifth X-direction profile of the pattern of the third region R3 in the X-direction is obtained (step S59). Further, in the image rotated by 180°, a sixth X-direction profile of the pattern of the fourth region R4 in the X-direction is obtained (step S60). The position of the fourth region R4 in the rotated image overlaps with the position of the third region R3 in the non-rotated image.

Thereafter, the X-direction rotational center position of the second mark 310 in the upper layer is calculated using the fifth X-direction profile and the sixth X-direction profile (step S61). Here, the rotational center position is calculated by using a method substantially the same as that for the X-direction rotational center position of the first mark 210.

Then, the difference between the X-direction rotational center positions of the first mark 210 in the lower layer and the second mark 310 in the upper layer is calculated as an X-direction overlay deviation amount (step S62). With the procedures described above, the X-direction overlay deviation amount is calculated. Then, a Y-direction overlay deviation amount is calculated with substantially the same procedures.

In the image obtained in step S51, a fifth region R5 is set to include the i-th to j-th segments 261 from the Y-direction negative side in the third component 223 of the first mark 210 in the lower layer (step S63).

Further, in this image, a sixth region R6 is set to include the k-th to m-th segments 261 from the Y-direction negative side in the fourth component 224 of the first mark 210 in the lower layer (step S64).

Then, from this image, a third Y-direction profile of the pattern of the fifth region R5 in the Y-direction is obtained (step S65). Further, in the image rotated by 180°, a fourth Y-direction profile of the pattern of the sixth region R6 in the Y-direction is obtained (step S66). The position of the sixth region R6 in the rotated image overlaps with the position of the fifth region R5 in the non-rotated image.

Thereafter, the Y-direction rotational center position of the first mark 210 in the lower layer is calculated using the third Y-direction profile and the fourth Y-direction profile (step S67). Here, the rotational center position is calculated by using a method substantially the same as that for the X-direction rotational center position of the first mark 210.

Then, in the image obtained in step S51, a seventh region R7 is set to include the i-th to j-th segments 361 from the Y-direction negative side in the eleventh component 323 of the second mark 310 in the upper layer (step S68).

Further, in this image, an eighth region R8 is set to include the k-th to m-th segments 361 from the Y-direction negative side in the twelfth component 324 of the second mark 310 in the upper layer (step S69).

Then, from this image, a fifth Y-direction profile of the pattern of the seventh region R7 in the Y-direction is obtained (step S70). Further, in the image rotated by 180°, a sixth Y-direction profile of the pattern of the eighth region R8 in the Y-direction is obtained (step S71). The position of the eighth region R8 in the rotated image overlaps with the position of the seventh region R7 in the non-rotated image.

Thereafter, the Y-direction rotational center position of the second mark 310 in the upper layer is calculated using the fifth Y-direction profile and the sixth Y-direction profile (step S72). Here, the rotational center position is calculated by using a method substantially the same as that for the X-direction rotational center position of the first mark 210.

Then, the difference between the Y-direction rotational center positions of the first mark 210 in the lower layer and the second mark 310 in the upper layer is calculated as a Y-direction overlay deviation amount (step S73). As a result, the overlay deviation amounts are calculated, and the processing sequence returns to FIG. 4.

With reference to FIG. 4 again, it is determined whether each of the overlay deviation amounts obtained as overlay measurement results in the overlay inspection apparatus falls within a permissible range (step S18). When either one of the overlay deviation amounts does not fall within the permissible range (No at step S18), the resist pattern 113 on the substrate 100 subjected to the overlay measuring process is peeled off, and a resist is newly applied onto the second layer 112 (step S19). Then, the substrate 100 with the resist applied thereon is placed on the stage of the light exposure apparatus (step S20), and the alignment measuring process using the first marks 210 is performed in the light exposure apparatus as in step S13 (step S21). Thereafter, in the light exposure apparatus, a light exposure process is performed, under light exposure conditions corrected for the overlay deviation amounts obtained in step S17 to be closer to zero, by using a photo mask including the second marks 310 (step S22). Thereafter, the processing sequence returns to step S15.

On the other hand, in step S18, when each of the overlay deviation amounts falls within the permissible range (Yes at step S18), the resist pattern 113 including the second marks 310 is transferred to the second layer 112 by, for example, anisotropic etching, such as a Reactive Ion Etching (RIE) method. Consequently, a processing object is obtained, in which the first layer 111 and the second layer 112 are stacked and provided with the first marks 210 and the second marks 310 arranged with positional relationship corresponding to each other. As a result, the processing sequence ends.

Figure 11A:
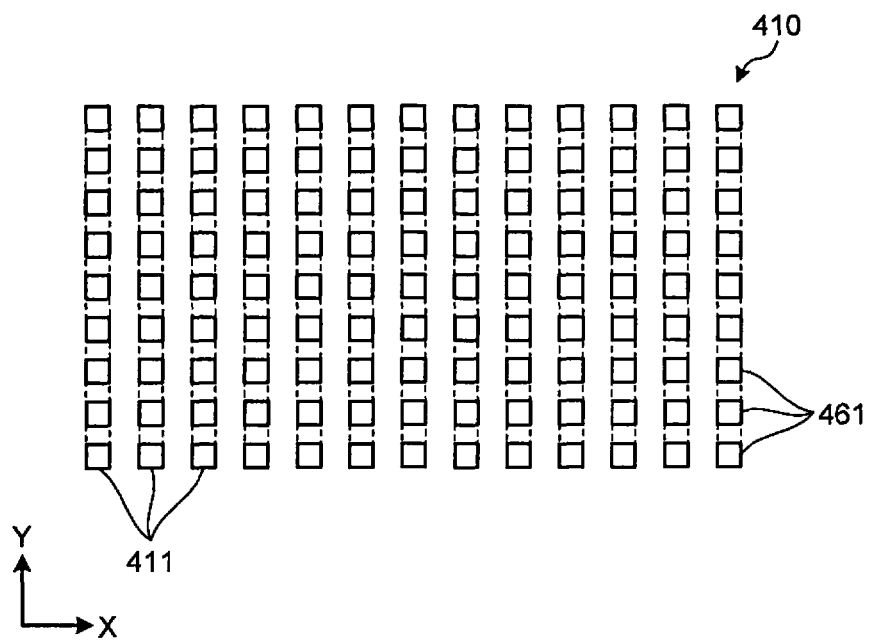
FIGS. 11A and 11B are plan views illustrating a configuration example of marks that can be used in diffraction light measurement according to the embodiment.
Figure 11B:
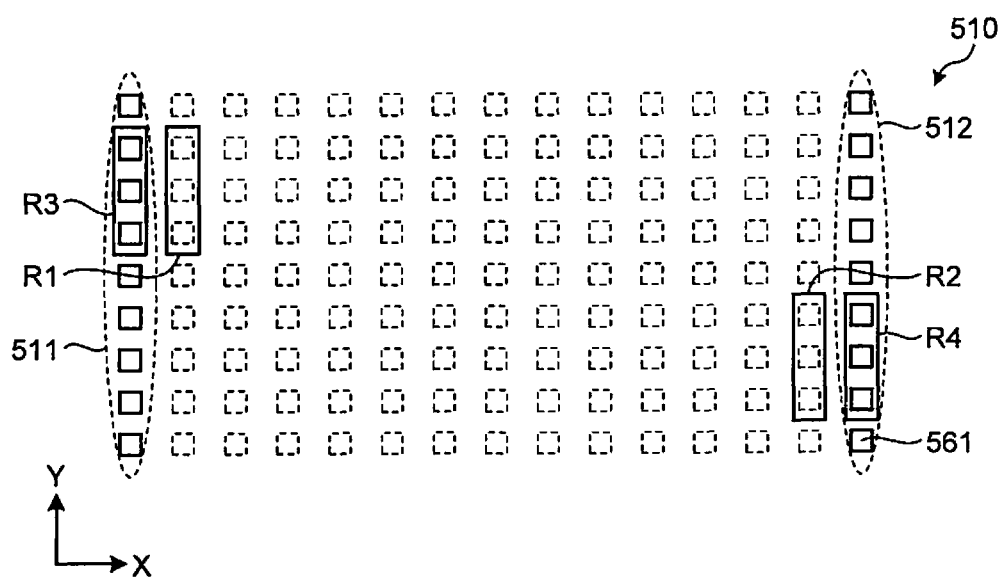

It should be noted that, the marks described above are designed to be used in bright field measurement, but the embodiment described above may be applied also to marks designed to be used in diffraction light measurement. FIGS. 11A and 11B are plan views illustrating a configuration example of marks that can be used in diffraction light measurement according to the embodiment. Here, FIG. 11A is a view illustrating a configuration example of a first mark, and FIG. 11B is a view illustrating a configuration example of a second mark.

As illustrated in FIG. 11A, in the mark arrangement region of the first layer, first marks 410 are arranged, which are to be used for diffraction light measurement for performing X-direction alignment. In each of the first marks 410, a plurality of line patterns 411 extending in the Y-direction are arranged in parallel with each other in the X-direction. Each of the line patterns 411 is divided into a plurality of segments 461.

Specifically, the plurality of segments 461 are arranged in the Y-direction at a pitch expressed by the formula (1) to form each line pattern 411. Consequently, in alignment measurement using light having the wavelength of λ1, the segments 461 are not resolved, and the line patterns 411 come to diffract light having the wavelength of λ1. Further, in overlay measurement using light having the wavelength of λ2 shorter than the wavelength of λ1, the segments 461 are resolved.

As illustrated in FIG. 11B, in the mark arrangement region of the resist pattern on the second layer, second marks 510 are arranged, in each of which two line patterns extending in the Y-direction are arranged in parallel with each other and to face each other in the X-direction. Each second mark 510 includes a first component 511 and a second component 512. Each of the first component 511 and the second component 512 is divided into a plurality of segments 561. Specifically, in each of the first component 511 and the second component 512, the plurality of segments 461 are arranged in the Y-direction at a pitch expressed by the formula (1) to form a line pattern.

Further, in this example, for the second mark 510, the distance between the first component 511 and the second component 512 is set such that, when the centers of the first mark 410 and the second mark 510 are made to agree with each other, the second mark 510 is present to have a predetermined distance from each of the line patterns 411 of the first mark 410 arranged at the ends in the X-direction. Here, in FIG. 11B, the first mark 410 in the lower layer is illustrated by broken lines.

In this case, the overlay measurement is performed by bright field measurement. A method for the bright field measurement is basically the same as that illustrated in FIG. 8A. However, since the marks illustrated in FIGS. 11A and 11B are marks for calculating an overlay deviation amount in the Y-direction, only a Y-direction overlay deviation amount is calculated. Accordingly, as illustrated in FIG. 11B, regions of from a first region R1 to a fourth region R4 are set to include segments 461 or 561 for performing the overlay measurement. Here, it is assumed that each of the line patterns of the first mark 410 and the second mark 510 consists of n-number of segments 461 or 561.

In the first mark 410 in the lower layer, some of the segments 461 in line patterns 411 arranged equidistantly from the X-direction center of the first mark 410 are used to perform the overlay measurement. FIG. 11B illustrates a case where some of the segments 461 in the line patterns 411 arranged at the opposite ends in the X-direction are used to perform the overlay measurement. The first region R1 is set as a region that includes the i-th to j-th segments 461 from the Y-direction negative side, of the segments 461 in the line pattern 411 arranged at the end on the X-direction negative side. The second region R2 is set as a region that includes the k-th to m-th segments 461 from the Y-direction negative side, of the segments 461 in the line pattern 411 arranged at the end on the X-direction positive side. Here, each of "i", "j", "k", and "m" is an integer of 1 or more and "n" or less, and "i"<"j", "k<m", "i≠k", and "j≠m" are satisfied. Also in this case, it is preferable to select a region including segments 461, which satisfy "i≥2", "j≤n−1", "k≥2", and "m≤n−1".

In the second mark 510 in the upper layer, the third region R3 is set as a region that includes the i-th to j-th segments 561 from the Y-direction negative side in the first component 511. The fourth region R4 is set as a region that includes the k-th to m-th segments 561 from the Y-direction negative side in the second component 512. The first mark 410 and the second mark 510 illustrated in FIGS. 11A and 11B are used as described above, and thereby X-direction alignment measurement and Y-direction overlay measurement can be performed.

In a case where the first mark 410 and the second mark 510 illustrated in FIGS. 11A and 11B are used, the mark arrangement region 102 is provided with not only this set of first mark 410 and second mark 510, but also another set of first mark 410 and second mark 510 that is in a state rotated by 90° in the plane of figures with respect to the first mark 410 and the second mark 510 illustrated in FIGS. 11A and 11B. Consequently, Y-direction alignment measurement and X-direction overlay measurement can be also performed.

The alignment measuring process using the first marks 210 illustrated in FIG. 6 is executed by a controller provided to the light exposure apparatus, for example. The overlay measuring process using the first marks 210 and the second marks 310 illustrated in FIGS. 9A and 9B is executed by a controller provided to the position measuring apparatus, for example.

Figure 12:
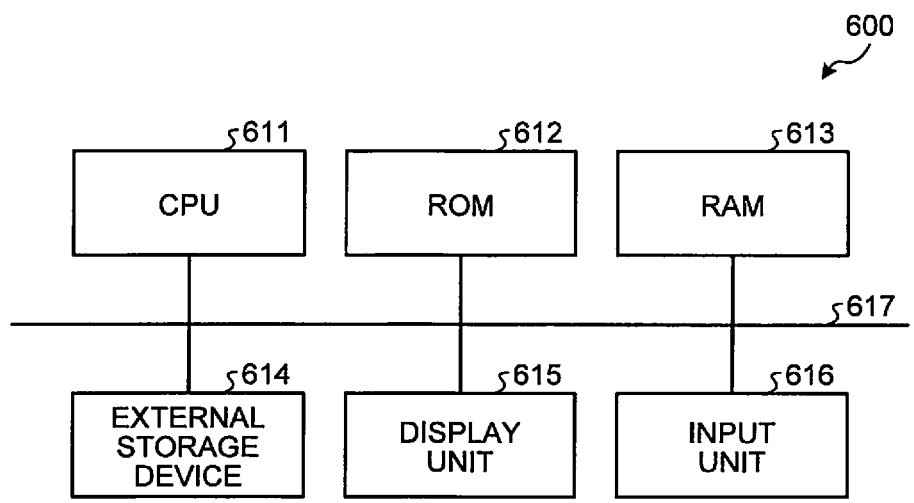
FIG. 12 is diagram illustrating a hardware configuration example of a controller for each of a light exposure apparatus and a position measuring apparatus.

FIG. 12 is diagram illustrating a hardware configuration example of a controller for each of the light exposure apparatus and the position measuring apparatus. The controller 600 has a hardware configuration utilizing an ordinary computer, in which a Central Processing Unit (CPU) 611, a Read Only Memory (ROM) 612, a Random Access Memory (RAM) 613 serving as the main storage device, an external storage device 614, such as a Hard Disk Drive (HDD), Solid State Drive (SSD), or Compact Disc (CD) drive device, a display unit 615, such as a display device, and an input unit 616, such as a keyboard and/or a mouse, are included, and are connected to each other via a bus line 617.

A program to be executed by the controller 600 according to this embodiment has been prepared to perform the alignment measuring process using the first marks 210 illustrated in FIG. 6, or the overlay measuring process using the first marks 210 and the second marks 310 illustrated in FIGS. 9A and 9B. This program is provided in a state recorded in a computer-readable recording medium, such as a CD-ROM, flexible disk (FD), CD-R, or Digital Versatile Disk (DVD), by a file in an installable format or executable format.

Alternatively, a program to be executed by the controller 600 according to this embodiment may be provided such that the program is stored in a computer connected to a network, such as the internet, and is downloaded via the network. Further, a program to be executed by the controller 600 according to this embodiment may be provided such that the program is provided or distributed via a network, such as the internet.

Alternatively, a program according to this embodiment may be provided in a state incorporated in an ROM or the like in advance.

According to the embodiment, each of the line patterns forming the marks is configured by arranging a plurality of segments in a state where the segments cannot be resolved by light having the wavelength of λ1 used for the alignment measurement but can be resolved by light having the wavelength of λ2 (<λ1) used for the overlay measurement. Consequently, the same mark can be used for either of the alignment measurement and the overlay measurement, and thus the number of marks to be arranged in the mark arrangement region 102 can be reduced. As a result, the area of the mark arrangement region 102 can be set smaller, while the area of the pattern arrangement region 101 can be set larger. This makes it possible to increase the storage capacity of a semiconductor memory device, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A position measuring method comprising:
    executing alignment measurement in a light exposure process by irradiating a first mark with light having a wavelength of λ1, with respect to a processing object that includes a first layer and a second layer stacked above a substrate and a resist applied on the second layer, in which the first mark is provided in the first layer and includes a plurality of segments arranged at a pitch smaller than a resolution limit given by light having the wavelength of λ1; and
    executing overlay measurement by irradiating the first mark and a second mark with light having a wavelength of λ2 shorter than the wavelength of λ1, the second mark having been formed by performing a light exposure and development process to the resist, and including a plurality of segments arranged at the pitch.

2. The position measuring method according to claim 1, wherein
    the first mark has a structure in which line patterns are arranged in quadrangular shapes that are doubly arranged, and
    the second mark has a structure in which line patterns are arranged in a quadrangular shape.

3. The position measuring method according to claim 2, wherein
    the first mark includes
        an inner pattern including a first component, a second component, a third component, and a fourth component arranged in a quadrangular shape, the first component and the second component extending in a first direction and being arranged in parallel with each other, the third component and the fourth component extending in a second direction perpendicular to the first direction and being arranged in parallel with each other, and
        an outer pattern including a fifth component, a sixth component, a seventh component, and an eighth component arranged in a quadrangular shape outside the inner pattern, the fifth component and the sixth component extending in the first direction and being arranged in parallel with each other, the seventh component and the eighth component extending in the second direction and being arranged in parallel with each other, and
    the second mark includes a ninth component, a tenth component, an eleventh component, and a twelfth component arranged in a quadrangular shape, the ninth component and the tenth component extending in the first direction and being arranged in parallel with each other, the eleventh component and the twelfth component extending in the second direction and being arranged in parallel with each other.

4. The position measuring method according to claim 3, wherein each of the components includes a plurality of segments arranged at the pitch in an extending direction of this component.

5. The position measuring method according to claim 3, wherein
    the executing alignment measurement includes
        obtaining a first image of the first mark by irradiation with light having the wavelength of λ1,
        grasping an inverse autocorrelation at first positions across the first component, the second component, the fifth component, and the sixth component using the first image, and calculating a position highest in this inverse autocorrelation as a center position in the second direction, and
        grasping the inverse autocorrelation at second positions across the third component, the fourth component, the seventh component, and the eighth component using the first image, and calculating a position highest in this inverse autocorrelation as a center position in the first direction, and
    the executing overlay measurement includes
        obtaining a second image of the first mark and the second mark by irradiation with light having the wavelength of λ2,
        calculating a rotational center position of the first mark in the first direction from a correlation between an intensity profile of some of segments forming the first component of the first mark in the second image, and an intensity profile of some of segments forming the second component of the first mark in a rotated second image formed by rotating the second image by 180°,
        calculating a rotational center position of the second mark in the first direction from a correlation between an intensity profile of some of segments forming the ninth component of the second mark in the second image, and an intensity profile of some of segments forming the tenth component of the second mark in the rotated second image,
        calculating an overlay deviation amount in the first direction from the rotational center positions of the first mark and the second mark in the first direction,
        calculating a rotational center position of the first mark in the second direction from a correlation between an intensity profile of some of segments forming the third component of the first mark in the second image, and an intensity profile of some of segments forming the fourth component of the first mark in the rotated second image,
        calculating a rotational center position of the second mark in the second direction from a correlation between an intensity profile of some of segments forming the eleventh component of the second mark in the second image, and an intensity profile of some of segments forming the twelfth component of the second mark in the rotated second image, and calculating an overlay deviation amount in the second direction from the rotational center positions of the first mark and the second mark in the second direction.

6. The position measuring method according to claim 5, wherein each of the first component, the second component, the third component, the fourth component, the ninth component, the tenth component, the eleventh component, and the twelfth component includes n-number of segments ("n" is an integer of 2 or more), the calculating the rotational center position of the first mark in the first direction includes obtaining a first intensity profile across a first region and a second intensity profile across a second region, the first region including i-th to j-th segments (each of "i" and "j" is an integer of 1 or more and "n" or less, and "i<j" is satisfied), counted from a first end in the first direction, of the first component of the first mark, the second region including k-th to m-th segments (each of "k" and "m" is an integer of 1 or more and "n" or less, and "k<m" is satisfied), counted from the first end in the first direction, of the second component of the first mark, and grasping a correlation, with respect to the first intensity profile, of the second intensity profile in the second image rotated by 180°, the calculating the rotational center position of the second mark in the first direction includes obtaining a third intensity profile across a third region and a fourth intensity profile across a fourth region, the third region including i-th to j-th segments, counted from the first end in the first direction, of the ninth component of the second mark, the fourth region including k-th to m-th segments, counted from the first end in the first direction, of the tenth component of the second mark, and grasping a correlation, with respect to the third intensity profile, of the fourth intensity profile in the second image rotated by 180°, the calculating the rotational center position of the first mark in the second direction includes obtaining a fifth intensity profile across a fifth region and a sixth intensity profile across a sixth region, the fifth region including i-th to j-th segments, counted from a second end in the second direction, of the third component of the first mark, the sixth region including k-th to m-th segments, counted from the second end in the second direction, of the fourth component of the first mark, and grasping a correlation, with respect to the fifth intensity profile, of the sixth intensity profile in the second image rotated by 180°, and the calculating the rotational center position of the second mark in the second direction includes obtaining a seventh intensity profile across a seventh region and an eighth intensity profile across an eighth region, the seventh region including i-th to j-th segments, counted from the second end in the second direction, of the eleventh component of the second mark, the eighth region including k-th to m-th segments, counted from the second end in the second direction, of the twelfth component of the second mark, and grasping a correlation, with respect to the seventh intensity profile, of the eighth intensity profile in the second image rotated by 180°.

7. The position measuring method according to claim 1, wherein the executing alignment measurement includes obtaining a first image of the first mark by irradiation with light having the wavelength of $\lambda 1$, and grasping an inverse autocorrelation at positions across the first mark using the first image and a reversed first image formed by reversing the first image, and calculating a position highest in this inverse autocorrelation as a center position, and the executing overlay measurement includes obtaining a second image of the first mark and the second mark by irradiation with light having the wavelength of $\lambda 2$, calculating a first rotational center position by using intensity profiles of the first mark same as each other in the second image and a rotated second image formed by rotating the second image by 180°, calculating a second rotational center position by using intensity profiles of the second mark same as each other in the second image and the rotated second image, and calculating an overlay deviation amount from the first rotational center position and the second rotational center position.

8. A position measuring apparatus performing position measurement by irradiating, with light, a region in which a first mark and a second mark are arranged with positional relationship corresponding to each other, wherein the first mark and the second mark are formed in layers different from each other in a measurement object, and each of the first mark and the second mark includes two first direction components that extend in a first direction and are arranged in parallel with each other, and two second direction components that extend in a second direction perpendicular to the first direction and are arranged in parallel with each other, such that the two first direction components face each other in the second direction while the two second direction components face each other in the first direction, each of the first direction components has a configuration in which n-number of segments ("n" is an integer of 2 or more) are arranged substantially at regular intervals in the first direction, and each of the second direction components has a configuration in which n-number of segments are arranged substantially at regular intervals in the second direction, the apparatus comprising:

a controller configured to obtain an image of a region including the first mark and the second mark, and calculate an overlay deviation amount between the first mark and the second mark in the image, wherein the controller is configured to calculate an overlay deviation amount in the first direction by performing a first process to each of the first mark and the second mark, the first process including obtaining a first intensity profile across a region including i-th to j-th segments (each of "i" and "j" is an integer of 1 or more and "n" or less, and "i<j" is satisfied), counted from a first end in the first direction, of one first direction component of the two first direction components, and a second intensity profile across a region including k-th to m-th segments (each of "k" and "m" is an integer of 1 or more and "n" or less, and "k<m", "i≠k", and "j≠m" are satisfied), counted from the first end in the first direction, of the other first direction component of the two first direction components, and calculating a rotational center position of a mark from a correlation, with respect to the first intensity profile, of the second intensity profile in the image rotated by 180°, and calculate an overlay deviation amount in the second direction by performing a second process to each of the first mark and the second mark, the second process including obtaining a third intensity profile across a region including i-th to j-th segments, counted from a second end in the second direction, of one second direction component of the two second direction components, and a fourth intensity profile across a region including k-th to m-th segments, counted from the second end in the second direction, of the other second direction component of the two second direction components, and calculating a rotational center position of a mark from a correlation, with respect to the third intensity profile, of the fourth intensity profile in the image rotated by 180°.

9. The position measuring apparatus according to claim 8, wherein, in each of the first mark and the second mark, the two first direction components and the two second direction components have sizes substantially same as each other.

10. The position measuring apparatus according to claim 8, wherein "i≥2", "j≤n−1", "k≥2", and "m≤n−1" are satisfied.

11. The position measuring apparatus according to claim 8, wherein "i+m=j+k=n+1" is satisfied.

12. The position measuring apparatus according to claim 8, wherein the i-th to j-th segments and the k-th to m-th segments partly include a segment present at a position same as each other counted from the first end in the first direction in the calculating the overlay deviation amount in the first direction, and partly include a segment present at a position same as each other counted from the second end in the second direction in the calculating the overlay deviation amount in the second direction.

13. A semiconductor device manufacturing method comprising:

preparing a light exposure object by forming, on a first layer provided with a first mark, a second layer and applying a resist onto the second layer, the first mark including a plurality of segments arranged at a pitch smaller than a resolution limit given by light having a wavelength of $\lambda 1$;

executing alignment measurement by irradiating the first mark provided in the first layer of the light exposure object with light having the wavelength of $\lambda 1$;

executing a light exposure process to the resist on a basis of a result of the alignment measurement;

forming a resist pattern that includes a second mark including a plurality of segments arranged at the pitch by executing a development process to the resist subjected to the light exposure process; and executing overlay measurement by irradiating the first mark and the second mark with light having a wavelength of $\lambda 2$ shorter than the wavelength of $\lambda 1$.

14. The semiconductor device manufacturing method according to claim 13, wherein the first mark has a structure in which line patterns are arranged in quadrangular shapes that are doubly arranged, and the second mark has a structure in which line patterns are arranged in a quadrangular shape.

15. The semiconductor device manufacturing method according to claim 14, wherein the first mark includes an inner pattern including a first component, a second component, a third component, and a fourth component arranged in a quadrangular shape, the first component and the second component extending in a first direction and being arranged in parallel with each other, the third component and the fourth component extending in a second direction perpendicular to the first direction and being arranged in parallel with each other, and an outer pattern including a fifth component, a sixth component, a seventh component, and an eighth component arranged in a quadrangular shape outside the inner pattern, the fifth component and the sixth component extending in the first direction and being arranged in parallel with each other, the seventh component and the eighth component extending in the second direction and being arranged in parallel with each other, and the second mark includes a ninth component, a tenth component, an eleventh component, and a twelfth component arranged in a quadrangular shape, the ninth component and the tenth component extending in the first direction and being arranged in parallel with each other, the eleventh component and the twelfth component extending in the second direction and being arranged in parallel with each other.

16. The semiconductor device manufacturing method according to claim 15, wherein each of the components includes a plurality of segments arranged at the pitch in an extending direction of this component.

17. The semiconductor device manufacturing method according to claim 15, wherein the executing alignment measurement includes obtaining a first image of the first mark by irradiation with light having the wavelength of $\lambda 1$, grasping an inverse autocorrelation at first positions across the first component, the second component, the fifth component, and the sixth component using the first image, and calculating a position highest in this inverse autocorrelation as a center position in the second direction, and grasping the inverse autocorrelation at second positions across the third component, the fourth component, the seventh component, and the eighth component using the first image, and calculating a position highest in this inverse autocorrelation as a center position in the first direction, and the executing overlay measurement includes obtaining a second image of the first mark and the second mark by irradiation with light having the wavelength of $\lambda 2$, calculating a rotational center position of the first mark in the first direction from a correlation between an intensity profile of some of segments forming the first component of the first mark in the second image, and an intensity profile of some of segments forming the second component of the first mark in a rotated second image formed by rotating the second image by 180°, calculating a rotational center position of the second mark in the first direction from a correlation between an intensity profile of some of segments forming the ninth component of the second mark in the second image, and an intensity profile of some of segments forming the tenth component of the second mark in the rotated second image, calculating an overlay deviation amount in the first direction from the rotational center positions of the first mark and the second mark in the first direction, calculating a rotational center position of the first mark in the second direction from a correlation between an intensity profile of some of segments forming the third component of the first mark in the second image, and an intensity profile of some of segments forming the fourth component of the first mark in the rotated second image, calculating a rotational center position of the second mark in the second direction from a correlation between an intensity profile of some of segments forming the eleventh component of the second mark in the second image, and an intensity profile of some of segments forming the twelfth component of the second mark in the rotated second image, and calculating an overlay deviation amount in the second direction from the rotational center positions of the first mark and the second mark in the second direction.

18. The semiconductor device manufacturing method according to claim 17, wherein each of the first component, the second component, the third component, the fourth component, the ninth component, the tenth component, the eleventh component, and the twelfth component includes n-number of segments ("n" is an integer of 2 or more), the calculating the rotational center position of the first mark in the first direction includes obtaining a first intensity profile across a first region and a second intensity profile across a second region, the first region including i-th to j-th segments (each of "i" and "j" is an integer of 1 or more and "n" or less, and "i<j" is satisfied), counted from a first end in the first direction, of the first component of the first mark, the second region including k-th to m-th segments (each of "k" and "m" is an integer of 1 or more and "n" or less, and "k<m" is satisfied), counted from the first end in the first direction, of the second component of the first mark, and grasping a correlation, with respect to the first intensity profile, of the second intensity profile in the second image rotated by 180°, the calculating the rotational center position of the second mark in the first direction includes obtaining a third intensity profile across a third region and a fourth intensity profile across a fourth region, the third region including i-th to j-th segments, counted from the first end in the first direction, of the ninth component of the second mark, the fourth region including k-th to m-th segments, counted from the first end in the first direction, of the tenth component of the second mark, and grasping a correlation, with respect to the third intensity profile, of the fourth intensity profile in the second image rotated by 180°, the calculating the rotational center position of the first mark in the second direction includes obtaining a fifth intensity profile across a fifth region and a sixth intensity profile across a sixth region, the fifth region including i-th to j-th segments, counted from a second end in the second direction, of the third component of the first mark, the sixth region including k-th to m-th segments, counted from the second end in the second direction, of the fourth component of the first mark, and grasping a correlation, with respect to the fifth intensity profile, of the sixth intensity profile in the second image rotated by 180°, and the calculating the rotational center position of the second mark in the second direction includes obtaining a seventh intensity profile across a seventh region and an eighth intensity profile across an eighth region, the seventh region including i-th to j-th segments, counted from the second end in the second direction, of the eleventh component of the second mark, the eighth region including k-th to m-th segments, counted from the second end in the second direction, of the twelfth component of the second mark, and grasping a correlation, with respect to the seventh intensity profile, of the eighth intensity profile in the second image rotated by 180°.

19. The semiconductor device manufacturing method according to claim 13, wherein the executing alignment measurement includes obtaining a first image of the first mark by irradiation with light having the wavelength of $\lambda 1$, and grasping an inverse autocorrelation at positions across the first mark using the first image and a reversed first image formed by reversing the first image, and calculating a position highest in this inverse autocorrelation as a center position, and the executing overlay measurement includes obtaining a second image of the first mark and the second mark by irradiation with light having the wavelength of $\lambda 2$, calculating a first rotational center position by using intensity profiles of the first mark same as each other in the second image and a rotated second image formed by rotating the second image by 180°, calculating a second rotational center position by using intensity profiles of the second mark same as each other in the second image and the rotated second image, and calculating an overlay deviation amount from the first rotational center position and the second rotational center position.

20. The semiconductor device manufacturing method according to claim 13, further comprising:

determining whether an overlay deviation amount between the first mark and the second mark obtained as a result of the overlay measurement falls within a permissible range;

peeling off the resist pattern when the overlay deviation amount does not fall within the permissible range; and applying a new resist onto the second layer, wherein to the light exposure object with the new resist applied thereon, processes of from the executing alignment measurement to the executing overlay measurement are executed.

* * * * *

UNITED STATES PATENT AND TRADEMARK OFFICE
CERTIFICATE OF CORRECTION

| | | |
|---|---|---|
| PATENT NO. | : 10,599,056 B1 | Page 1 of 1 |
| APPLICATION NO. | : 16/263427 | |
| DATED | : March 24, 2020 | |
| INVENTOR(S) | : Miki Toshima et al. | |

It is certified that error appears in the above-identified patent and that said Letters Patent is hereby corrected as shown below:

In the Claims

Claim 20, Column 18, Line 62, "of from" should read as --from--.

Signed and Sealed this
Seventeenth Day of May, 2022

Katherine Kelly Vidal
*Director of the United States Patent and Trademark Office*